(12) United States Patent
Ganry

(10) Patent No.: US 6,996,032 B2
(45) Date of Patent: Feb. 7, 2006

(54) BIST CIRCUIT FOR MEASURING PATH DELAY IN AN IC

(75) Inventor: Olivier Ganry, Beaverton, OR (US)

(73) Assignee: Credence Systems Corporation, Milpitas, CA (US)

( * ) Notice: Subject to any disclaimer, the term of this patent is extended or adjusted under 35 U.S.C. 154(b) by 294 days.

(21) Appl. No.: 10/628,996

(22) Filed: Jul. 28, 2003

(65) Prior Publication Data

US 2005/0028050 A1 Feb. 3, 2005

(51) Int. Cl.
*G04F 10/00* (2006.01)
*G04F 11/00* (2006.01)
*G01R 31/28* (2006.01)

(52) U.S. Cl. .................. 368/118; 714/727; 714/733; 324/763; 324/765

(58) Field of Classification Search ............... 368/113, 368/18, 120; 324/763, 765; 714/724–727, 714/733
See application file for complete search history.

(56) References Cited

U.S. PATENT DOCUMENTS

| | | | |
|---|---|---|---|
| 4,701,920 A | * 10/1987 | Resnick et al. | 714/733 |
| 4,875,201 A | 10/1989 | Dalzell | |
| 5,206,861 A | * 4/1993 | Hannon et al. | 714/731 |
| 5,226,048 A | * 7/1993 | Bandali et al. | 714/724 |
| 5,473,618 A | * 12/1995 | Takeshita et al. | 714/733 |
| 5,923,676 A | 7/1999 | Sunter et al. | |
| 6,058,496 A | 5/2000 | Gillis et al. | |
| 6,314,537 B1 | * 11/2001 | Oh | 714/718 |

* cited by examiner

*Primary Examiner*—Vit W. Miska
(74) *Attorney, Agent, or Firm*—Daniel J. Bedell; Smith-Hill and Bedell

(57) ABSTRACT

A BIST circuit for an IC measures the time delay a rising or falling edge experiences as it passes through a signal path within the IC. A strobe circuit within the BIST circuit generates edges in two signals A and B in delayed response to edges of a STROBE signal. A path probe generates a signal C edge at the signal path input in response to each signal A edge. The STROBE-to-B edge delay within the strobe generator is iteratively adjusted to determine a first delay for which the path probe detects the B and C signal edges at nearly the same time and thereafter iteratively adjusted to determine a second delay for which the path probe detects the B and D signal edges at nearly the same time. The first delay is measured by causing the strobe signal generator to produce a periodic signal having a period proportional to the first delay and counting the number of cycles of a reference clock occurring during K cycles of the periodic signal. The second delay is measured in a similar manner. The path delay is determined as a difference between the measured first and second delays.

28 Claims, 6 Drawing Sheets

BIST CIRCUIT FOR MEASURING PATH DELAY IN AN IC

CROSS-REFERENCE TO RELATED APPLICATIONS

The present application discloses subject matter in common with a copending U.S. patent application entitled "SELF-CALIBRATING STROBE SIGNAL GENERATOR" Ser. No.10/628,995 filed concurrently herewith.

BACKGROUND OF THE INVENTION

1. Field of the Invention

The present invention relates in general to built-in/self-test (BIST) circuits and in particular to a BIST circuit for determining whether a path delay within and integrated circuit (IC) is within acceptable limits.

2. Description of Related Art

Integrated circuit (IC) manufacturers often use general purpose IC testers to test ICs by applying test signals to their I/O terminals and monitoring the IC's output signals to see how they respond to the test signal. But as integrated circuits (ICs) have become larger and more complex, IC manufacturers have found it more difficult and time-consuming to use a general purpose IC tester to test every sub-circuit of a large IC. For example, large ICs often include "embedded circuits" such memories that other circuits within an IC access but which are not directly accessible through an IC's I/O terminals and which an external tester therefore cannot directly access. To help reduce testing time and to enable testing of embedded circuits, designers have begun to incorporate built-in self-test ("BIST") circuits into IC's for testing various circuits within an IC.

For example, a typical BIST circuit for testing a memory includes a "core wrapper" normally linking the memory's terminals to other circuits within the IC that read and write access the memory. However during a test, the core wrapper links the memory terminals to the BIST circuit's memory testing core. After conducting a test, in response to a command from an external device such as a host computer or an IC tester, the BIST circuit returns data to the external device indicating test results. BIST circuits typically communicate with IC terminals via a "scan bus" including a data line interconnecting all of the BIST circuits in daisy chain fashion for serially conveying data into and out of all BIST circuits, a clock line for clocking data through the data line, and one or more control lines connected in parallel to all BIST circuits for indicating when data they have received is valid and other purposes. To tell the BIST circuits to carry out tests, the external host computer shifts commands and control data serially through the data line to scan registers within the BIST circuits and then pulses a control line to tell them that valid data is available in the scan registers. After the BIST circuits have completed their tests, they load test result data into the scan registers and the host computer then shifts test result data back out of the IC via the scan bus data line. Thus using the scan bus, a host computer or external IC test equipment can communicate with many BIST circuits though only a relatively few IC terminals.

An IC can fail to function properly when a delay through a signal path within the IC is too long or too short. U.S. Pat. No. 5,923,676 issued Jul. 13, 1999 to Sunter et al describes a BIST circuit for measuring a delay through a signal path within an IC. During a first test procedure, the BIST circuit connects a reference path across the inputs and outputs of the path under test so that the reference path and the path under test form a first ring oscillator. The BIST circuit counts the number of cycles of a stable reference clock signal that occur during a predetermined number N of cycles of a periodic signal produced by the first ring oscillator. The BIST circuit then passes that first count to an external host computer. During a second test procedure, the BIST circuit connects the reference path's output to its input so that the reference path alone forms a second ring oscillator. The BIST circuit then counts the number of cycles the reference clocks signal that occur during N cycles of the periodic signal produced by the second ring oscillator. The BIST circuit then sends the second count to the external host computer. The external host computer can then compute the delay through the path under test based on the difference between the two counts, the value of N, and the period of the reference clock.

A signal path will typically delay rising and falling edges of a signal by differing amounts due to the lack of symmetry in the switching speeds of logic gates forming the signal path. One drawback to the BIST circuit described by Sunter et al is that the "path delay" that it measures is neither the rising edge delay nor the falling edge delay but the average of the two. In some applications, it is necessary to differentiate between the two types of path delays.

U.S. Pat. No. 6,058,496 issued May 2, 2000 to Gillis et al describes a strobe signal generator for generating first and second strobe signals having edges separated by an adjustable time delay for use in measuring a delay through a signal path in an IC. The first strobe signal edge sends a rising or falling signal edge to the input of the signal path and the other strobe signal tells a latch to sample the state of a resulting signal appearing at the output of the signal path. The state of a data bit stored in the latch indicates whether the delay through the signal path is longer or shorter than the known delay between the first and second strobe signals. The strobe signal generator derives the two strobe signal edges from the same clock signal edge but it passes the second strobe signal edge through a programmable delay circuit that the first strobe signal edge bypasses. Thus, the programmable delay circuit controls the delay between the first and second strobe signal edges.

Gillis teaches a calibration process for adjusting the programmable delay circuit to provide a desired delay between the first and second strobe signal edges wherein the output of the programmable delay circuit is fed back to the strobe signal generator's clock signal input so that the strobe signal generator acts like an oscillator having a period that is equal to the sum of delays though the programmable delay circuit and the inherent path delay in other portions of the feedback loop. With the delay circuit set for "zero delay", the number of cycles of the oscillator output signal occurring during N cycles of a stable reference clock signal are then counted. The count is saved as a reference value. The delay through the programmable delay circuit is then increased and the number of cycles of the oscillator output signal occurring during N cycle of the reference clock signal are again counted. The difference K between the new cycle count and the reference count is nominally proportional to the delay through the programmable delay circuit, with the known period of the reference clock being the constant of proportionality. Thus, the programmable delay is increased until difference K reaches a value that is expected for the desired strobe delay.

While this system can separately measure rising and falling edge path delays, one difficulty with this system is that during the calibration process, the delay through the programmable delay circuit cannot really be set to zero since all programmable delay circuits have some residual delay when they are at their lowest setting. Thus, the delay provided by the calibration process exceeds the expected delay at least by the amount of the residual delay which can be a considerable amount compared to the path delay to be measured. Another drawback is that the system does not account for differences in path delays the first and second strobe signals may experience as they travel to the latch, so it is important when laying out an IC to make sure that the two paths closely match one another. The calibration circuit taught by Gillis is also relatively complicated, including an arithmetic logic unit, several counters and registers and the like along with sequencing logic capable of controlling operations of all of these parts.

What is needed is a BIST circuit which, like the circuit described in U.S. Pat. No. 6,058,496, can separately measure rising and falling edge delays through a signal path within an IC, but which can do so with greater accuracy and with less complicated hardware.

BRIEF SUMMARY OF THE INVENTION

A BIST circuit in accordance with the invention measures rising and/or falling edge delays through a signal path within an IC and optionally determines whether they are within acceptable limits. The BIST circuit includes a "path probe" proximate to the signal path that can compare timing of two signal edges and generating an output signal indicating which of the two signal edges occurred first. The BIST circuit also includes a strobe generator that sends edges of two signals A and B to the path probe in delayed response to edges of a STROBE signal. The STROBE-to-A edge delay is fixed, but the STROBE-to-B delay is adjustable. During an initial calibration phase, the STROBE-to-B delay is initially set small so that the signal B edge arrives at the path probe before the signal A edge. But after each successive edge of the STROBE signal, the STROBE-to-B delay is incremented until the path probe detects arrival of the A edge before it detects arrival of the B edge.

The strobe generator is then configured to produce an oscillating output signal OSCOUT having a period that is proportional to (suitably twice) the STROBE-to-B delay. The BIST circuit sets a count number (COUNT) to zero and then increments COUNT on each cycle of a stable reference clock signal that occurs during a predetermined number K of cycle of the OSCOUT signals. The BIST circuit saves the resulting count as calibration data CD.

The strobe generator is then configured to again send A and B edges to the path probe in response to the STROBE signal edge with the STROBE-to-B delay starting small but increasing after each STROBE signal edge. With the path probe configured to pass signal A as a signal C input to the signal path to be measured, the signal path produces edges in its output signal D in delayed response to the edges in its input signal C. However, this time the path probe compares the timing of the B and D signal edges, and the process stops when the path probe indicates that the D signal edge arrives before the B signal edge.

At that point, the strobe signal is again made to produce the OSCOUT signal with a period twice that of the STROBE-to-B delay. The BIST circuit then increments the COUNT data during each cycle of the CLOCK signal that occurs during K cycles of the OSCOUT signal, but this time the count starts at a negative number (−CD) rather than at 0. AT the end of K cycles of the OSCOUT signal the COUNT data value will be proportional to the path delay PD though the signal path as follows:

$$PD=(PCLK/2K)COUNT$$

where PCLK is the known period of the CLOCK signal employed as a timing reference. The BIST circuit then generates a pass/fail bit (P/F) indicating whether the COUNT data value is writing an acceptable range.

Input programming data determines whether BIST circuit measures path delay using rising or falling edges of the C signal passing through the signal path so that it can separately determine both rising and falling edge delays. The range of COUNT values for which the BIST circuit determines path delay is acceptable can also be set by input programming data.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

DETAILED DESCRIPTION OF THE INVENTION

The invention relates to a built-in/self-test (BIST) circuit that may be included within an integrated circuit (IC) for determining whether a rising or falling edge delay through a signal path within the IC is within acceptable limits. For illustrative purposes, the BIST circuit is described below as being used to measure a path delay through an input/output (I/O) cell of an IC, but a BIST circuit in accordance with the invention can be used to measure a path delay through any signal path within an IC that produces a rising or falling output signal edge in delayed response to a rising or falling input signal edge.

IC Architecture

Figure 1:
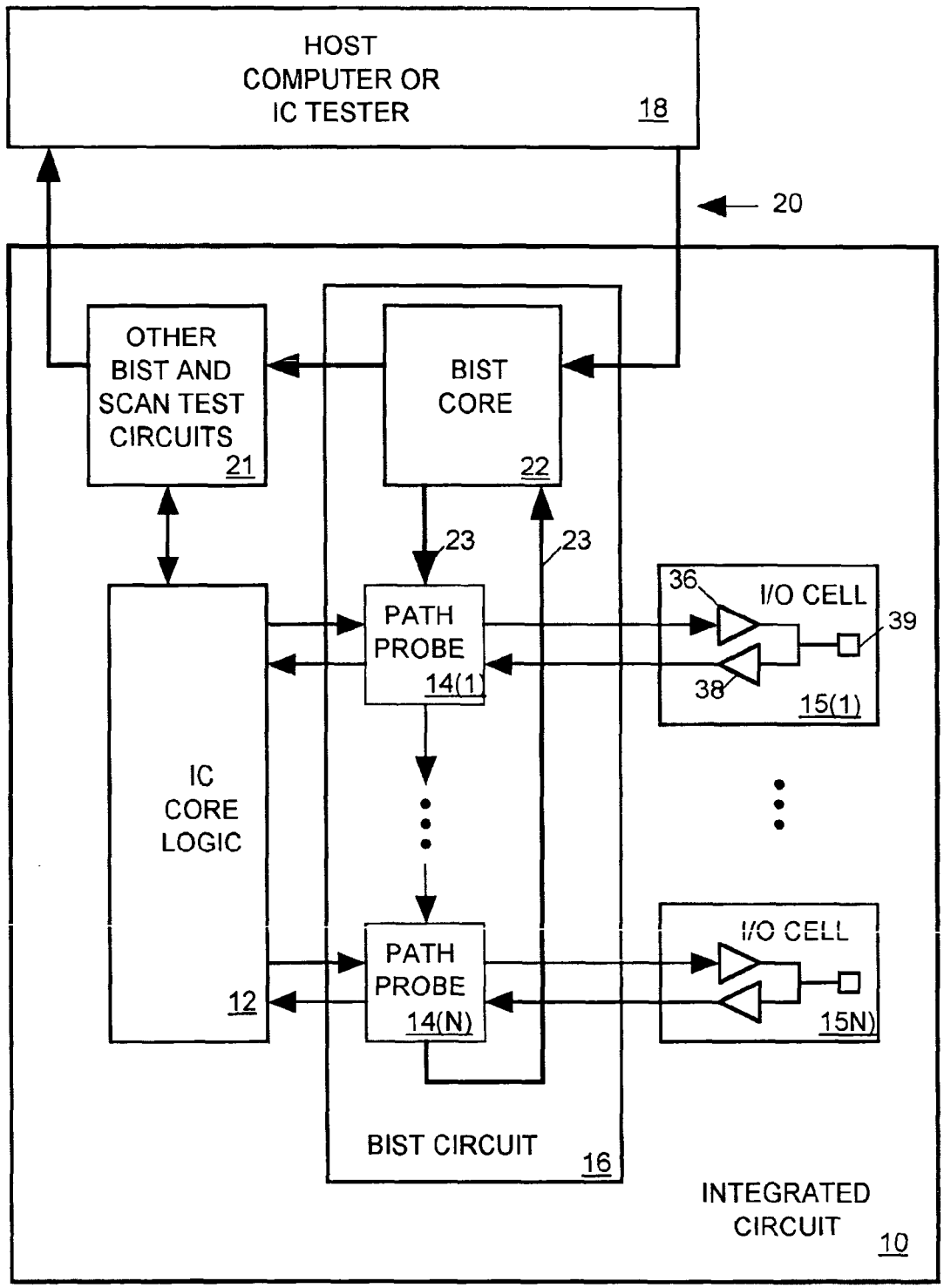
FIG. 1 is a block diagram of an integrated circuit including built-in/self-test (BIST) circuits in accordance with the invention.

FIG. 1 illustrates in block diagram form an IC 10 including core logic 12 for carrying out the logic performed by the IC. Core logic 12 communicates with circuits outside IC 10 through a set of I/O cells 15(1)–15(N), each including a driver 36 and a receiver 38 connected to a pad 39 providing a point of connection for external circuits. IC 10 includes a BIST circuit 16 in accordance with the invention for verifying that path delays though I/O cells 15(1)–15(N) are within a range that will allow IC 10 to communicate with external circuits at an appropriate frequency. BIST circuit 16 includes a BIST core 22 and a separate "path probe" circuit 14(1)–14(N) positioned near each corresponding I/O cell 15(1)–15(N). Each path probe 14(1)–14(N) normally links core logic circuit 12 its corresponding I/O cells 15(1)–15(N) so that it can transmit and receive signals to and from external circuits via that I/O cells. However during testing, BIST core 22 signals each path probe 14(1)–14(N) via a bus 23 to disconnect its corresponding I/O cell 15(1)–15(N) from core logic 12 and to thereafter assist BIST core 22 in measuring the path delay experienced by a leading or trailing test signal edge as it makes a round trip from the path probe, though the I/O cells' driver 36 and receiver 38 and back to the path probe. BIST circuit 16 then determines whether the measured path delay is within acceptable limits.

BIST circuit 16 suitably communicates with external equipment such as, for example, a host computer or an integrated circuit tester 18 through a conventional scan bus 20, and host computer 18 may also use scan bus 20 to communicate with other types of BIST or scan test circuits 21 included in IC 10 for testing other aspects of core logic 12 or for providing host computer or tester 18 with input/output access data that is internal to core logic 12. Host computer 18 serially shifts control data, commands and results data through registers within BIST circuit 16 and scan test circuits 21 via scan bus 20. The control data host 18 sends to BIST circuit 16 before the start of a test tells it which of I/O cells 15(1)–15(N) are to be tested, indicates whether the BIST circuit is to measure leading or trailing edge path delays though those I/O cells, and indicates the range of path delays through those I/O cells 15 the BIST circuit is to consider acceptable. BIST circuit 16 reports test results back to host computer 18 via scan bus 20. Thus, in an IC having scan bus for other purposes, BIST circuit 16 requires no additional IC pins to communicate with external equipment.

Measurement Process

Figure 2:
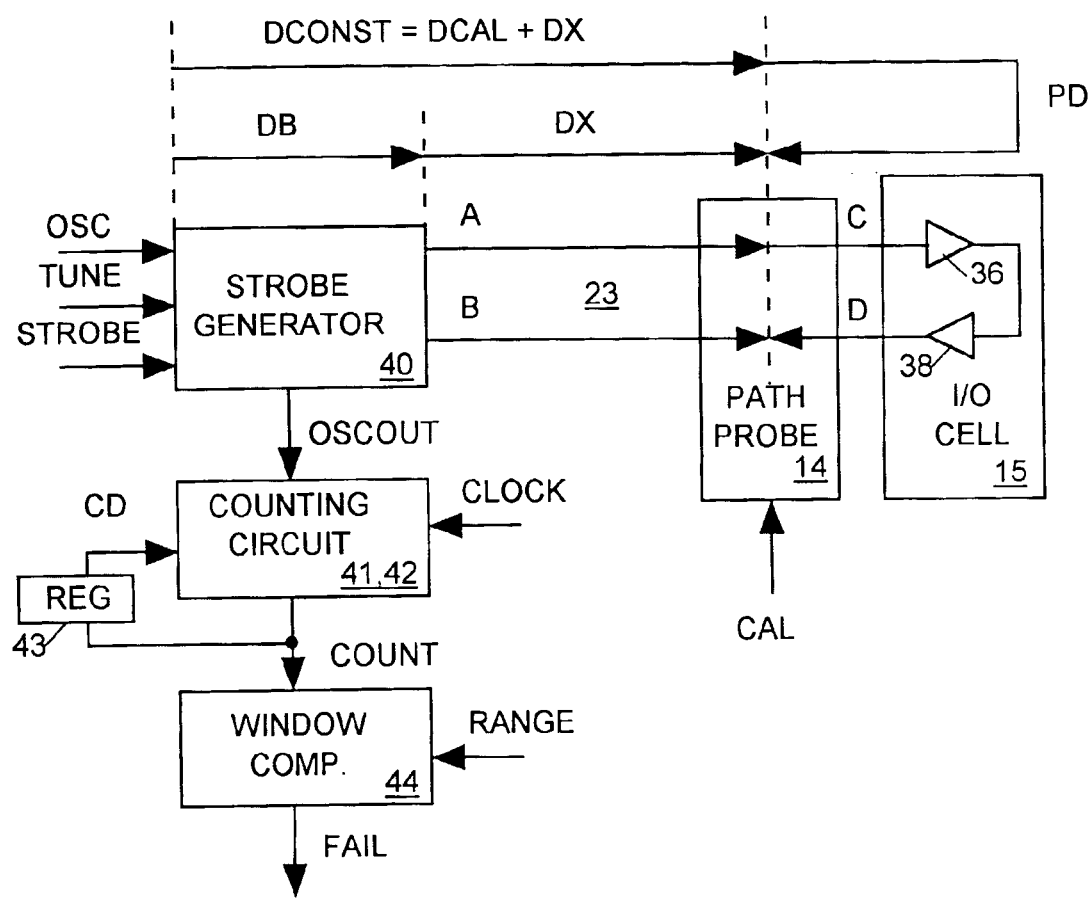
FIG. 2 is a simplified block diagram illustrating how BIST circuit 16 measures the path delay through an I/O cell 15.

FIG. 2 is a simplified block diagram illustrating how BIST circuit 16 measures the path delay through an I/O cell 15. BIST circuit 16 includes a strobe generator circuit 40 that repeatedly responds to an edge of a STROBE signal by sending edges of two signals A and B to a path probe 14 via control bus 23. In response to the A signal, path probe 14 generates an edge in a signal C it supplies as input to the driver 36 of I/O cell 15. I/O cell 15 responds to the edge in signal C by producing an edge in a signal D produced at the output of receiver 38 supplied as input to path probe 14. The delay between the edges in the C and D signals is the path delay PD to be measured.

Strobe generator 40 generates the A edge with a fixed delay following the STROBE signal edge, but generates the B edge with a variable delay following the STROBE signal edge controlled by input TUNE data. A control data bit (CAL) supplied to path probe 14 tells it to initially determine whether it detects the outgoing edge C departs path probe 14 before or after incoming edge B arrives at path probe 14. Initially the TUNE data sets the delay of edge B short so that edge C is sure to depart path probe 14 after edge B arrives. Path probe 14 therefore initially reports that edge C departs after edge B arrives. However, the TUNE data tells strobe generator 40 to increase the delay of edge B by a small amount until path probe 14 detects that edge C departs just before edge B arrives. At that point, an input control signal OSC tells strobe generator 40 to begin generating an output signal OSCOUT having a period that is proportional to twice the current STROBE-to-B edge delay. A counting circuit 41, 42 count cycles of a stable system clock (CLOCK) having a known period that occur during a predetermined number (K) of cycles of the OSCOUT signal. The resulting count is then stored as calibration data (CD) in a register 43.

Strobe generator 40 now repeats the process of sending A and B signal edges to path probe 14 in response to each pulse of the STROBE signal, with the STROBE-to-B delay starting small and becoming increasingly larger. During this phase of the test, the CAL input to path probe 14 tells it to compare the relative arrival times of the D and B edges and to report when strobe generator 40 has increased the B edge delay to the point where path probe 14 detects edge D before it detects edge B. The OSC signal then again tells strobe generator 40 to generate its output signal OSCOUT having a period that is twice that of the current STROBE-to-B delay. Counting circuit 41, 42 again counts cycles of the CLOCK signal occurring during a predetermined number of cycles of the OSCOUT signal, but this time the count begins at a number that is less than 0 by the value of calibration data CD, where CD is the previous COUNT data stored in register 43.

After K cycles of the OSCOUT signal, the value of the resulting COUNT data produced by counters 41, 42 is now proportional to the path delay (PD) through I/O cell 15 as follows:

$$PD=(PCLK/2K)COUNT \quad [1]$$

where K is the fixed number of OSCOUT cycles counted and PCLK is the known period of the CLOCK signal. A window comparator 44 determines whether the path delay PD through I/O cell 15 is within an acceptable range by determining whether the COUNT value is within a range specified by RANGE data supplied by the host computer.

The basis for equation [1] is explained as follows. The delay between the STROBE signal edge and the departure of edge C at from path probe 14 is a constant DCONST. During the calibration procedure, when path probe 14 compares B and C signal edge timing, strobe generator 40 adjusts the STROBE-to-B delay within strobe generator 40 to a value DCAL such that the C edge departs path probe 14 at, as nearly as possible, the same time as the B edge arrives at path probe 14. Thus $$DCONST=DCAL+DX \quad [2]$$

where DX is the path delay between strobe generator 40 and path probe 14. During the I/O signal path measurement phase, when path probe 14 compares timing of edges B and D, strobe generator 40 sets the B delay to a value DB such that $$DCONST+PD=DB+DX \quad [3]$$

From [2] and [3] it can be shown that $$PD=DB-DCAL \quad [4]$$

Equation [4] tells us that the path delay through I/O cell 15 is equal to the difference between the STROBE-to-B signal path delay DB through strobe generator 40 when path probe 14 detects B and D edges occur at nearly the same time, and the STROBE-to-B path delay DCAL during the calibration procedure when path probe detects C and B edges occur at nearly the same time.

If the COUNT output of counters 41, 42 produced at the end of the process were not offset by the value of calibration data CD in register 43, the resulting value of COUNT would be proportional to the strobe generator's internal STROBE-to-B delay DB, but since the final COUNT value has been offset by CD=DCAL(2K/PCLK), the resulting COUNT value is $$COUNT=DB(2K/PCLK)-CD$$

$$COUNT=DB(2K/PCLK)-DCAL(2K/PCLK) \quad [5]$$

Solving [5] for path delay PD=DB−DCAL, we arrive at equation [1] above, $$PD=(PCLK/2K)COUNT$$

When the acceptable range for PD resides between some minimum and maximum values PDMIN and PDMAX, then host computer 18 sets the RANGE data to tell window comparator 44 to consider the path delay to be within the acceptable range when $$COUNTMAX<COUNT<COUNTMIN$$

where $$COUNTMAX=PDMAX(2K/PCLK) \text{ and}$$

$$COUNTMIN=PDMIN(2K/PCLK).$$

BIST Circuit Architecture

Figure 3:
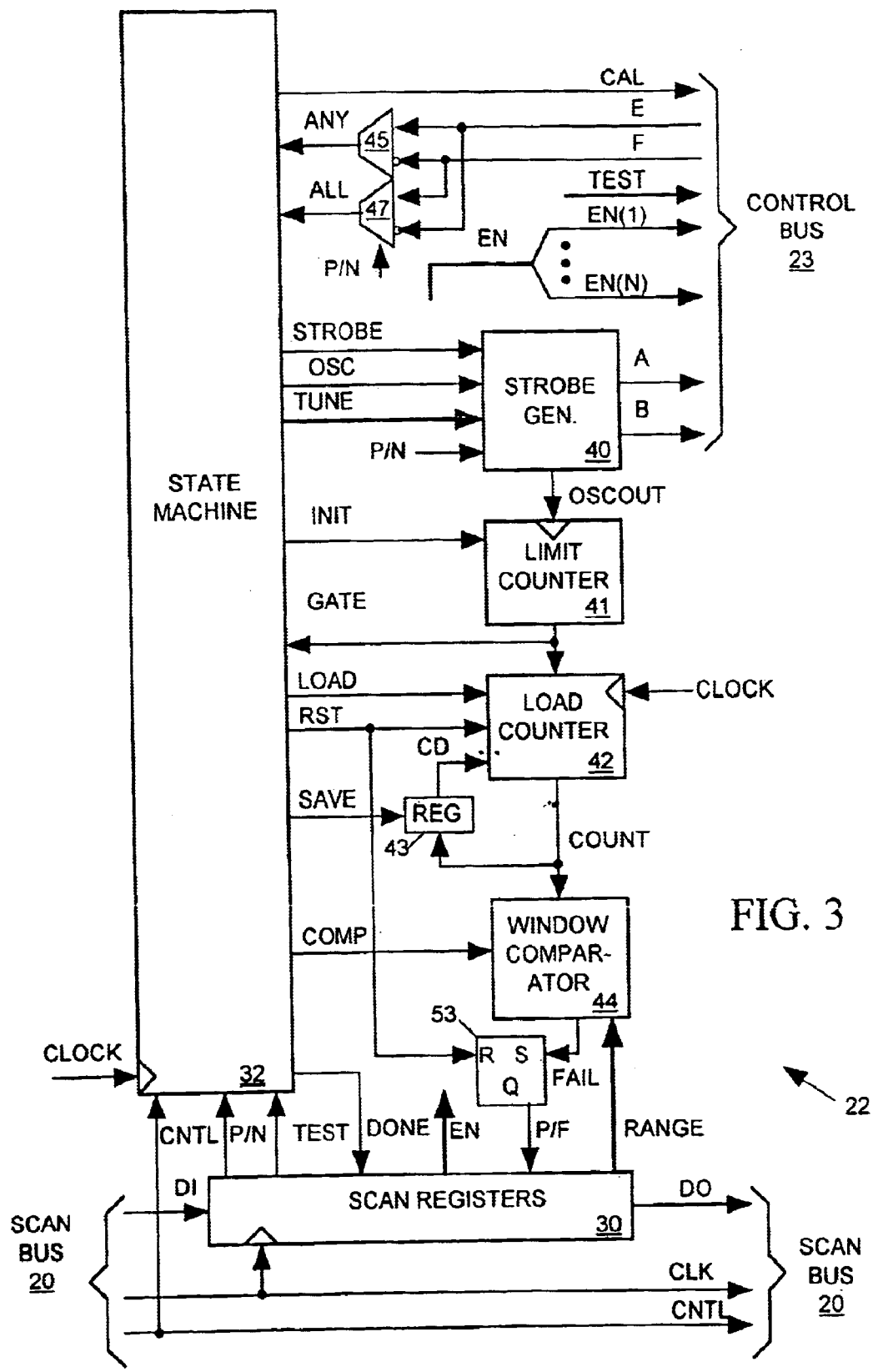
FIG. 3 illustrates the BIST core of FIG. 1 in more detailed block diagram form.
Figure 4:
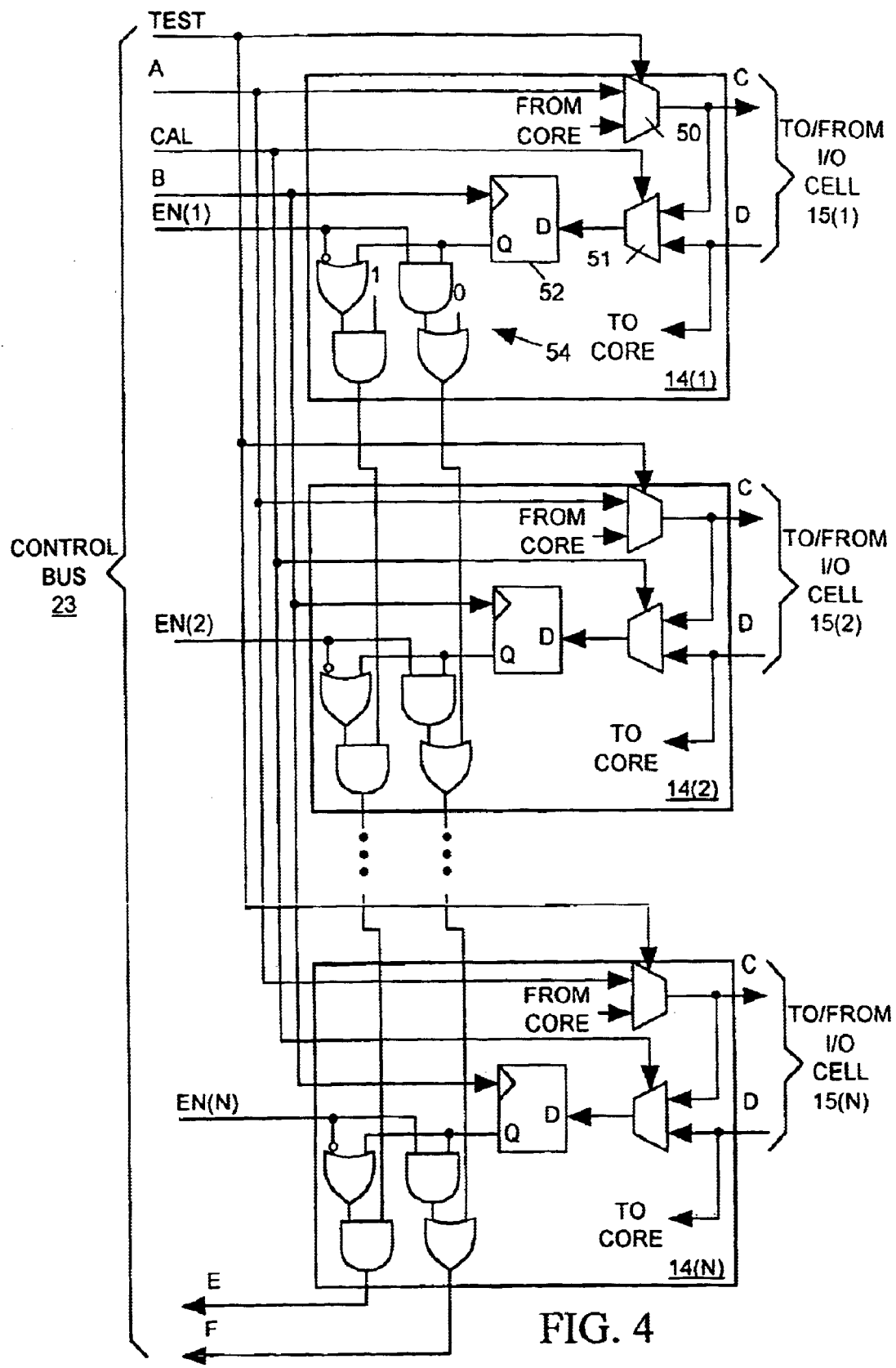
FIG. 4 illustrates the path probes of FIG. 3 1 more detailed block diagram form.

FIG. 3 illustrates BIST core 22 and FIG. 4 illustrates path probes 14(1)–14(N) in more detailed block diagram form. Referring to FIGS. 1, 3 and 4, BIST core 22 includes a set of scan registers 30 providing interface to scan bus 20. Scan bus 20 includes a data input line DI through which host computer 18 shifts control data into scan registers 30, a data output line DO though which scan registers 30 shift their data contents out to host computer 18 and a clock line (CLK) the host computer uses for clocking data through the scan registers. When host computer 18 wants BIST 16 to measure path delays through one or more of I/O cells 15(1)–15(N), it shifts TEST, EN, P/N, RANGE data into scan registers 30, and then asserts a control signal CNTL on another control line of scan bus 20 to indicate that valid data is in the register.

The TEST data is a single bit acting as a command to tell BIST circuit 16 that is it begin measuring the path delay in one or more I/O cells 15(1)–15(N). The EN data includes N bits EN(1)–EN(N), each corresponding to a separate one of I/O cells 15(1)–15(N) and indicating whether the path delay through the corresponding cell is to be measured. The EN data allows host computer 18 to determine whether the signal path delay through each I/O cell is to be tested during separate scan test cycles or whether the path delays through two or more of the I/O cells are to be measured during the same scan test cycle.

The P/N data is a single bit indicating whether BIST circuit 16 is to measure a rising or falling edge path delay through the I/O cells. Rising and falling edges will often not experience the same delay through a path formed by one or more gates because the switching speed of gate often varies depending on whether it is switching in response to a rising or falling edge at its input. Thus, BIST circuit 16 is adapted to selectively measure either rising or falling edge delays. The RANGE data indicates a range for the I/O cell path delay that BIST circuit 16 is to consider acceptable.

Figure 5:
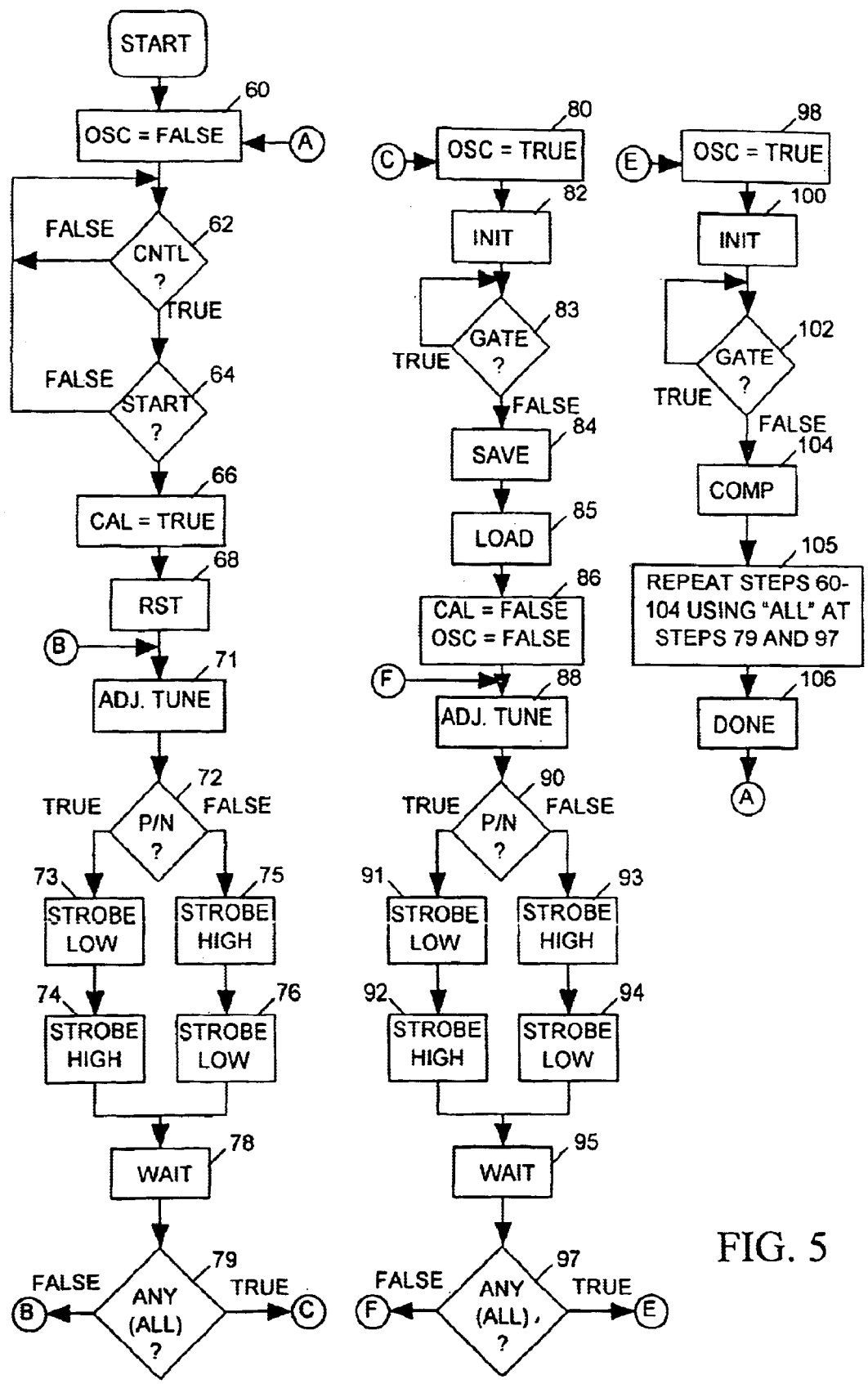
FIG. 5 is a flow chart illustrating behavior of the state machine of FIG. 3.

FIG. 5 is a flow chart illustrating behavior of a state machine 32 of FIG. 3 that acts as the BIST circuit's master controller. Referring to FIGS. 1 and 2–5, state machine 32 initially sets an input signal OSC to strobe generator 40 logically false on system start up (step 60) to tell the strobe generator that it is not to generate the OSCOUT signal but is instead to produce A and B signal edges in response STROBE signal edges state machine 32 will later produce. State machine 32 then begins monitoring the scan bus control signal CNTL (step 62), and when it detects host computer 18 has asserted the CNTL signal, the state machine checks the TEST bit in control registers 30 to see whether it is logically true (step 62). When the TEST bit is logically true, state machine 32 begins a test cycle by setting a CAL signal on a line of control bus 23 logically true (step 66), pulsing a reset signal input to a counter 42 to reset its output count to zero (step 68) and to a reset input of an RS flip-flop 53 supplying a pass/fail (P/F) bit input to scan registers 30. The P/F output of flip-flop 53 is initially set true to indicate that the IC has passed the test, but as discussed below, window comparator 44 will later set the P/F output bit of flip-flop 53 false if the IC subsequently fails the test. State machine 32 also adjusts data (TUNE) supplied as input to strobe generator 40 (step 71) to set the STROBE-to-B edge delay to a minimum.

In addition to telling state machine 32 to initiate a test cycle, the TEST signal also tells a multiplexer 50 within each of path probes 14(1)–14(N) (FIG. 4) to disconnect the output of IC core logic 12 (FIG. 1) from the input of the driver 36 within its corresponding I/O cell 15(1)–15(N) and to instead connect a line of control bus 23 conveying an output A of strobe generator 40 to the I/O driver input. The CAL signal, set logically true at step 66, tells a multiplexer 51 in each path probe 14(1)–14(N) to deliver the output signal C of multiplexer 50 to a D input of a logic gate 52, suitably a flip-flop, clocked by the B edge output of strobe generator 40. Flip-flop 52 supplies its Q output to a set of logic gates 54, and its Q output indicates the state of the C signal at its D input at the time it is clocked by the B edge. Thus during the calibration procedure, the Q output of flip-flop 52 indicates whether the C signal edge arrived at flip-flop 52 via multiplexers 50 and 51 before or after the B signal edge arrives at its clock input.

After setting up path probes 14(1)–14(N) for the calibration procedure, state machine 32 adjusts the TUNE data input to strobe generator 40 to provide a minimal STROBE-to-B edge delay (step 71). State machine 32 sends a STROBE signal pulse strobe generator 40. When the P/N bit stored in scan registers 30 is logically true, indicating that the rising edge delay through the I/O cells is to be measured (step 72), state machine 32 initially drives the STROBE signal edge low (step 73), and then high again (step 74) to send a rising STROBE signal edge to STROBE generator 40. Conversely, when the P/N bit stored in scan registers 30 is logically false, indicating that the falling edge delay is to be measured (step 72), state machine 32 initially drives the STROBE signal high (step 75), and then low (step 76) to send a falling STROBE signal edge to STROBE generator 40. Strobe generator 40 then sends A and B edges in sequence to path probes 14(1)–14(N).

The EN data that the host computer stored in one of scan registers 30 includes a separate bit EN(1)–EN(N) delivered via bus 23 to a corresponding one of path probes 14(1)–14 (N) and each bit is set logically true or false to indicate whether the corresponding I/O cell's path delay is to be measured during the current scan test cycle. The EN(1)–EN (N) bits provide inputs to the logic gates 54 that also receive the Q output of flip-flop 52. The logic gates 54 of all path probes 14(1)–14(N) are interconnected to one another and, through a pair of data lines E and F, to inputs of a pair of multiplexers 45 and 47 within BIST core 22 controlled by the P/N bit stored in scan registers 30. Multiplexers 45 and 47 supply two signals, ANY and ALL, as input to state machine 32. The ANY signal is set logically true when the Q output of any one of path probes 14(1)–14(N) currently enabled by its corresponding EN(1)–EN(N) bit detects that the C signal edge has arrived at its D input before the B signal edge arrives at its clock input. The ALL signal is driven logically true only if the Q output of every one of path probes 14(1)–14(N) currently enabled by its corresponding EN(1)–EN(N) bit detects that the C signal edge has arrived at its D input before the B signal edge arrives at its clock input. If only one of the EN(1)–EN(N) bits is logically true, then only one of path probes 14(1)–14 (N) is enabled, and the ANY and ALL bits will both indicate the same thing, whether the flip-flop 51 in the one enabled path probe has detected arrival of the A edge before arrival of the B edge.

After sending the rising or falling STROBE edge to strobe generator 40 at step 73 or 75, machine 32 waits (step 78) for a time sufficient to allow the B signal edge to arrive at the clock inputs of the flip-flops 52 within path probes 14(1)–14(N) and then checks the state of the ANY signal (step 79). When the ANY signal is logically false, indicating that none of the enabled path probes 14(1)–14(N) have detected arrival of the C edge before arrival of the B edge, state machine 32 returns to step 71 to adjust the TUNE data to increment the STROBE-to-B delay and then sends another STROBE edge to the strobe generator. The process continues to loop though steps 71–79 until at step 79 the ANY signal is of a logically true state indicating that at least one enabled path probe has detected arrival of the C edge before arrival of the B edge.

BIST circuit 16 must now measure the current STROBE-to-B edge delay in order to produce the calibration data CD. To do so, state machine first sets the OSC signal input to strobe generator 40 logically true (step 80) so that strobe generator 40 produces the OSCOUT signal having a period equal to twice its current internal STROBE-to-B delay. State machine 32 then pulses an INIT signal input to a limit counter 41 (step 82) telling it to drive an output signal GATE logically true, and to then begin counting cycles of the OSCOUT signal. Limit counter 41 counts starting from 0 up to its predetermined limit K and then drives its GATE signal logically false again.

While the GATE signal is logically true, a counter 42 counts cycles of the system CLOCK signal, and when counter 41 reaches its count limit K, it drives the GATE signal logically false and counter 42 stops counting CLOCK signal cycles. When state machine 32 detects that the GATE signal has turned logically false (step 83), it pulses a SAVE signal (step 84) to save the current count in a register 43 as the calibration data input CD of counter 42, and then pulses a LOAD signal (step 85) telling counter 42 to reset its output COUNT to a value equal to −CD, the negative of its current output COUNT. Thus the next time the GATE signal swings logically true to allow counter 41 to resume is count, it will begin the count at −CD. At this point (step 86), state machine 32 sets the CAL signal logically false to tell the multiplexer 51 in each path probe 14(1)–14(M) to deliver the D signal output of the I/O cells to the D inputs of flip-flops 52 and sets the OSC signal input to strobe generator 40 logically false to prepare it to begin generating sending A and B signal edges in response to STROBE signal edges. State machine 32 adjusts the TUNE data to tell strobe generator 40 to increment the B strobe w delay (step 88), and then, depending on whether P/N is logically true or logically false (step 90), sends a negative-going STROBE pulse (steps 91 and 92) or a positive-going strobe pulse (steps 93 and 94) to strobe generator 40. State machine 32 then waits (step 95) until the ANY signal output of multiplexer 45 has had time to reflect the results of the B-to-D edge timing comparison flip-flops 52 makes in response to the B signal edges. State machine 32 then determines whether the ANY signal is logically true (step 97) indicating that the flip-flops 52 in all of the path probes 14(1)–14(N) that are enabled by EN data bits have detected arrival of the D edge after the B edge. Since the B edge delay is initially short, ANY will initially be logically false. Thus, state machine 32 repeats steps 88 through 97, repetitively increasing the B edge delay with each pass through step 88 until at step 97 it finds that its ANY signal input is logically true.

At that point (step 98) state machine 32 sets the OSC signal logically true so that strobe generator 40 starts generating the OSCOUT signal with a period twice that of its current internal STROBE-to-B edge delay, and then pulses the INIT signal input to limit counter 41. Counter 41 then again sets GATE logically true and then counts K cycles of the OSCOUT signal before driving GATE logically false again. While GATE is logically true, counter 42 resumes counting CYCLES of the CLOCK signal, with its output COUNT output with the count starting at −CD.

When counter 41 drives GATE logically false again to inhibit counter 42 from counting any higher, state machine 32 sends a COMP signal pulse to window comparator 44 (step 104) telling it to pulse it FAIL signal output to set flip-flop 53 if the COUNT data value is not within the acceptable range indicated by the RANGE data stored in scan registers 30. Thus, the P/F bit flip-flop 53 supplies to scan registers 30 will be set true at step 104 if the path delay through the fastest enabled I/O pin is not within the range indicated by the RANGE data input to comparator 44.

At step 105 the entire test (steps 60–104) is repeated, except that at steps 79 and 97, the ALL bit output of multiplexer 47, rather than the ANY bit output of multiplexer 45 is checked. Thus when state machine 32 pulses the COMP signal during the second pass through step 104, window comparator 44 will pulse the FAIL signal to set flip-flop 53 if the path delay through the slowest enabled I/O pin is not within the range indicated by the RANGE data.

State machine 32 then pulses a DONE signal input to one of scan registers 30 telling it to store the P/F bit to indicate test results, and a DONE bit indicating that the test has been successfully completed (step 106). Host computer 18 then reads the DONE and P/F bits during a next scan bus data cycle to determine whether BIST circuit 16 has successfully completed the test and whether BIST circuit 16 found the path delay though all enabled I/O cells to be within acceptable limits. Thereafter, state machine 32 returns to step 60, sets OSC logically false to stop the OSCOUT signal from oscillating (step 60) and then waits for a next CNTL signal edge (step 62).

During the scan bus data cycle in which host computer 18 reads the DONE and P/F bits it may, for example, also change the EN data in scan registers 30 to select another I/O cell or group of I/O cells to be tested, or to change the P/N bit to change whether the rising or falling edge delay is tested. When no more testing is to be carried out, host computer 18 sets the TEST bit in scan registers 30 logically false to tell path probes 14(1)–14(N) to reconnect IC core logic 12 to I/O cells 15(1)–15(N).

When all I/O cells are to have the same delay range, host computer 18 can initially set each of enable bits EN logically true so that all path probes 14(1)–14(N) are enabled. The resulting P/F bit, if logically true, indicates that the delays through all I/O cells 15(1)–15(N) are within the range indicated by the RANGE data. A logically false P/F bit indicates only that the delay through one or more of I/O cells 15(1)–15(N) might be out of range. Upon detection of a logically false P/F bit, host computer 18 could successively set up BIST circuit 16 to separately measure the delay though each I/O cell 15(1)–15(N) in turn.

Strobe Circuit Architecture

Figure 6:
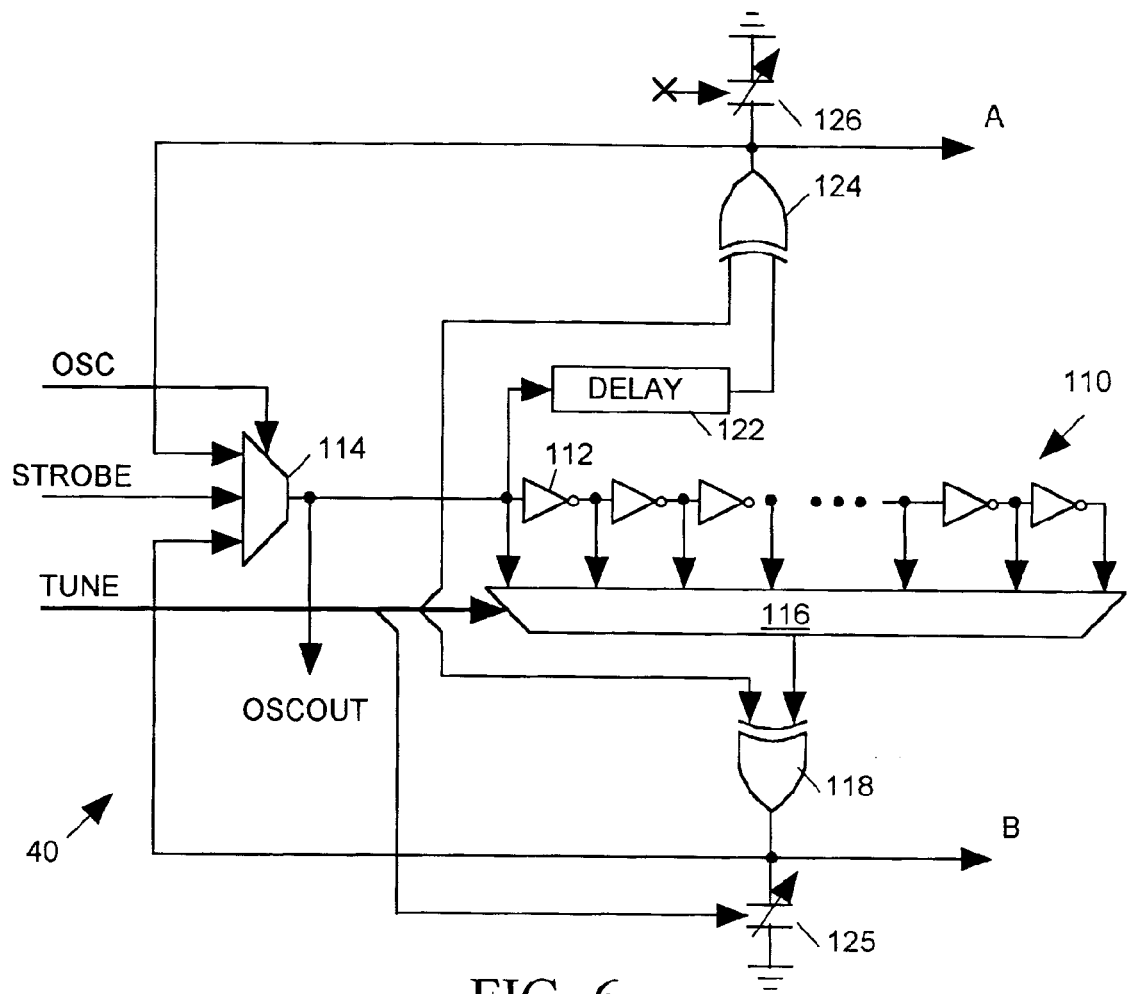
FIG. 6 illustrates the strobe generator of FIG. 3 in more detailed block diagram form.

FIG. 6 is a block diagram illustrating an example implementation of strobe generator 40 of FIG. 3. Strobe generator 40 includes a tapped delay line 110 formed by a set of gates, suitably inverters 112, and a multiplexer 114 controlled by the OSC signal for delivering the STROBE signal to the input of delay line 110 when OSC is logically false. A multiplexer 116 controlled by the TUNE data links one of the delay line taps selected by the TUNE data to an input of and XOR gate 118 that produces signal B at its output. The STROBE-to-B edge delay is therefore roughly determined by which delay line tap the TUNE data selects with a resolution equal to the path delay through one inverter 112. A variable capacitor 125 controlled by one or more additional bits of the TUNE data adds capacitance to the output of multiplexer 118. The TUNE data sets the capacitance of variable capacitor 125 to finely adjust the STROBE-to-B edge delay.

Another of the bits of the TUNE data supplies another input to XOR gate 118 and is set so that the B signal edge that is to clock the flip flops in the path probes changes state in the appropriate direction. A fixed delay circuit 122 links the first tap of delay line 110 to an input of an other XOR gate 124 producing signal A at its output such that the STROBE-to-A edge delays are fixed. Delay circuit 22 suitably includes a sequence of gates that mimic the path delay that the STROBE signal encounters as is passes through multiplexer 116 to reach the input of XOR gate 118. Delay circuit 112 could be implemented by a multiplexer identical to multiplexer 116, but which is set to always connect the first delay line tap to the input of XOR gate 124. When OSC is logically false, multiplexer 114 feeds signal B back to the input of delay line 110 to form a ring oscillator producing the period OSCOUT signal at the output of multiplexer 114 having a period that is twice the current STROBE-to-B signal delay. The output of XOR gate 124 drives an input of multiplexer 114 but multiplexer 114 only mimics the loading on XOR gate 118. Multiplexer 114 never selects its signal A input. A variable capacitor 126 similar to capacitor 125 can also be connected to the output of XOR gate 124 to mimic the loading of capacitor 125 on gate 118 when capacitor 125 is set for minimum capacitance. But the control data input to variable capacitor 126 is hard-wired for selecting minimum capacitance.

Figure 7:
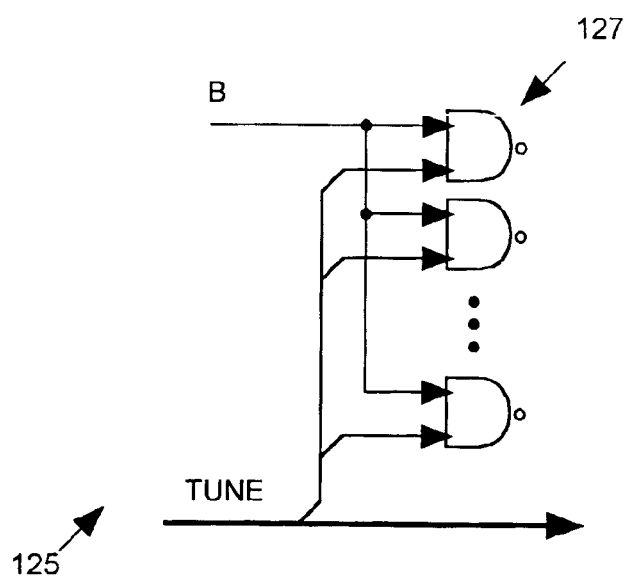
FIG. 7 illustrates the variable capacitor of FIG. 6 in block diagram form.

FIG. 7 illustrates a circuit for implementing variable capacitor 125 of FIG. 6 including a set of one or more NAND gates 127, each receiving the B signal at one input and a separate bit of the TUNE data at another input. The outputs of NAND gates 127 are open-circuited. When the TUNE bit input to any NAND gate 127 goes high, the capacitive loading that NAND gate provides at the output of multiplexer 114 increases due to the Miller effect, thereby increasing the STROBE-to-B path delay, suitably by approximately DINV/(N+1), where DINV is the unit delay of each inverter 112 and N is the number of NAND gates 127. Those of skill in the art will appreciate that variable capacitor 125 of FIG. 6 may be implemented in other ways.

Delay Reporting BIST

In some applications the host computer, IC tester or other device communicating with BIST circuit 16 may want to know the actual delay though a signal path that the BIST circuit measures, for example when an IC is to be binned (rated) according to the magnitude of the delay, rather than merely being accepted or rejected according to whether the path delay resides within acceptable limits. To do so the host computer can command the BIST circuit to run the test more than once with the range represented by the RANGE data being adjusted after each iteration of the test in response to the last returned state of the P/F bit so as to converge on the actual path delay within a very narrow range. Alternatively, window comparator 44 of FIG. 3 can be eliminated and the COUNT output of counter 42 can be provided as an input to scan registers 30. The DONE output signal of state machine 42 would therefore load the COUNT data (rather than the single-bit P/F data) output of window comparator 44 into scan registers 30 at the end of the test. The COUNT data is then returned to host computer 18 during the next scan data cycle so that the host computer can determine the measured delay from the COUNT data value.

The foregoing specification and the drawings depict an exemplary embodiment of the best mode of practicing the invention, and elements or steps of the depicted best mode exemplify the elements or steps of the invention as recited in the appended claims. However the appended claims are intended to apply to any mode of practicing the invention comprising the combination of elements or steps as described in any one of the claims, including elements or steps that are functional equivalents of the example elements or steps of the exemplary embodiment(s) of the invention depicted in the specification and drawings.

What is claimed is:

1. An apparatus for carrying out a measurement process for measuring a delay through a signal path within an integrated circuit (IC), the apparatus comprising:
   a strobe generator,
      for receiving an OSC signal that may be either logically true or logically false, for receiving TUNE data, and for receiving a STROBE signal,
      for generating a signal A and a signal B when the OSC signal is logically false, each having an edge produced in delayed response to an edge of a STROBE signal supplied as input to the strobe generator, wherein the strobe generator provides a fixed delay between the STROBE signal edge and the signal A edge and provides a variable delay between the STROBE signal edge and the signal B edge, and wherein the variable delay is selected by TUNE data supplied as input to the strobe generator, and
      for generating an OSCOUT signal when the OSC signal is logically true, wherein the OSC output signal has a period that is proportional to the variable delay selected by the TUNE data; and
   a path probe implemented on the IC
      for receiving, a TEST signal and a CAL signal that may be either logically true or logically false,
      for generating a signal C at the signal path input in response to signal A when the TEST signal is logically true such that the signal path produces a signal D at its output, wherein each of signals C and D change state in response to each signal A edge;
      for receiving signals B and D;
      for responding to each signal B edge when the CAL signal is logically true by generating at least one indicating signal indicating whether signal C changed state before the path probe received the signal B edge, and
      for responding to each signal, B edge when the CAL signal is logically false by generating said least one indicating signal indicating whether signal D changed state before or after the path probe received the signal B edge.

2. The apparatus in accordance with claim 1 wherein the strobe generator is implemented within the IC.

3. The apparatus in accordance with claim 1 further comprising a control circuit for supplying the STROBE signal and TUNE data as inputs to the strobe generator, for supplying the CAL signal as input to the path probe, and for monitoring the indicating signal generated by the path probe.

4. The apparatus in accordance with claim 3 wherein the control circuit is implemented within the IC.

5. The apparatus in accordance with claim 3 wherein during a first phase of the measurement process, the control circuit sets the OSC signal logically false, sets the CAL signal logically true, and then executes a plurality of iterations of a process in which during each iteration of the process, it adjusts the TUNE data, sends a STROBE signal edge to the strobe generator, and then monitors the indicating signal produced by the path probe, wherein the control circuit sets the TUNE data so that the strobe generator generates signal B edges with a different delay there between during each iteration of the process, until a pattern of successive indicating signal states indicates the TUNE data has reached a first setting for which the path probe circuit has receives the C and B edges nearly concurrently, wherein during a second phase of the measurement process, the control circuit sets the OSC signal TRUE so that the strobe generator generates the OSCOUT signal having a period that is proportional to the variable delay selected by the TUNE data at the first setting, wherein during a third phase of the measurement process, the control circuit sets the OSC signal logically false, sets the CAL signal logically false, and then executes a plurality of process iterations during each of which it adjusts the TUNE data, sends a STROBE signal edge to the strobe generator, and then monitors the indicating signal produced by the path probe, wherein the control circuit sets the TUNE data so that the strobe generator generates signal B edges with a different delay there between during each iteration of the process, until a pattern of successive indicating signal states indicates the TUNE data has reached a second setting for which the path probe circuit has receives the D and B edges nearly concurrently, and wherein during a fourth phase of the measurement process, the control circuit sets the OSC signal TRUE so that the strobe generator generates the OSCOUT signal having a period that is proportional to the variable delay selected by the TUNE data at the second setting.

6. The apparatus in accordance with claim 5 further comprising a measurement circuit for monitoring the OSCOUT signal during the second and fourth phases of the measurement process to determine a path delay between edges of signals C and D.

7. The apparatus in accordance with claim 6 wherein the measurement circuit generates output data representing a difference between the period of the OSCOUT signal during the fourth phase of the measurement process, and the period of the OSCOUT signal during the second phase of the measurement process.

8. The apparatus in accordance with claim 6 wherein the measurement circuit generates output data representing a difference between a first number of cycles of a reference clock signal that occur during K cycles of the OSCOUT signal during the fourth phase of the measurement process, and a second number of cycle of the reference clock signal that occur during K cycles of the OSCOUT signal during the second phase of the measurement process, where K is an integer greater than 1.

9. The apparatus in accordance with claim 8 wherein the measurement circuit comprises:

a first counter for receiving the OSCOUT signal and for setting a GATE signal logically true for K cycles of the OSCOUT signal, and thereafter setting the GATE signal logically false; and a second counter for counting cycles of the reference clock signal occurring only while the GATE signal is logically true, and for generating the output data indicating its current count, wherein for the second phase of the measurement process, the second counter initially sets its output count to a value 0 and then increments the output count during each cycle of the reference clock signal while the GATE signal is logically true to produce a count having a first value when the GATE signal is subsequently set logically false, such that the first value is proportional to the variable delay selected by the TUNE data at the first setting, and wherein for the fourth phase of the measurement process, the second counter initially sets its output count to a value that is less than 0 by the amount of the first value and then increments the output count during each cycle of the reference clock signal while the GATE signal is logically true to produce a count having a second value when the GATE signal is subsequently set logically false, such that the second value is proportional to a difference between the variable delays selected by the TUNE data at the second and first settings.

10. The apparatus in accordance with claim 9 further comprising a circuit for receiving the count generated by the second counter and for generating pass/fail data indicating whether the count is of a value residing within a predetermined range.

11. The apparatus in accordance with claim 2 wherein the strobe generator comprises:

a tapped delay line having an input and a plurality of taps, for delivering any signal appearing at its input to each of its taps with a different delay;

means for generating signal A in response to a signal appearing at one of the taps;

a first multiplexer controlled by the TUNE data for generating signal B in response to a signal appearing at any selected one of the taps, and a second multiplexer controlled by the OSC signal for selectively delivering either the STROBE signal or signal B as input to the tapped delay line.

12. The apparatus in accordance with claim 1 wherein the path probe comprises:

a logic gate having a control input for receiving signal B, a data input, and a data output for producing the indicating signal, such that the indicating signal is of a logic state that indicates a logic state of a signal at the data input when a B signal edge last arrived at the clock input, and a first multiplexer controlled by the CAL signal for selectively coupling either the C or D signal to the data input of the first logic gate.

13. The apparatus in accordance with claim 1 wherein the TUNE data also controls whether signal A changes to a state that matches or is opposite to a state of the STROBE signal during each signal A edge.

14. The apparatus in accordance with claim 10 wherein the strobe generator comprises:

a tapped delay line having an input and a plurality of taps, for delivering any signal appearing at its input to each of its taps with a different delay;

means for generating signal A in response to a signal appearing at one of the taps;

a first multiplexer controlled by the TUNE data for generating signal B in response to a signal appearing at any selected one of the taps, and a second multiplexer controlled by the OSC signal for selectively delivering either the STROBE signal or signal B as input to the tapped delay line.

15. The apparatus in accordance with claim 14 wherein the path probe comprises:

a gate having a control input for receiving signal B, a data input, and a data output for producing the indicating signal, such that the indicating signal is of a logic state that indicates a logic state of a signal at the data input when a B signal edge last arrived at the clock input, and a first multiplexer controlled by the CAL signal for selectively coupling either the C or D signal to the data input of the first logic gate.

16. The apparatus in accordance with claim 15 wherein the TUNE data also controls whether the signal A edge generated in response to each rising STROBE signal edge is a rising or falling signal edge.

17. The apparatus in accordance with claim 11 wherein the strobe generator further comprises:

a variable capacitor providing an amount of capacitance at the linked delay line selected by the TUNE data.

18. A method for measuring rising and falling edge path delays between an input and output of a signal path within an IC of the type which produces an output signal D at its output having edges in delayed response to an input signal C at its input, the method comprises:

a. forming a path probe within the IC proximate to the signal path and connected to the signal path's input and output wherein the path probe supplies the signal C to the signal path input in response to an input signal A, and monitors the signal D produced at the signal path output;

b. generating and supplying signal A and a signal B to the path probe, wherein signals A and B have edges generated in response to edges of a STROBE signal, wherein a STROBE-to-A edge delay is constant and a STROBE-to-B edge delay is variable, c. adjusting the STROBE-to-B edge delay to a first delay for which the path probe receives signal B edges and generates signal C edges nearly concurrently d. producing a first periodic signal having a period proportional to the first delay;

e. adjusting the STROBE-to-B edge delay to a second delay for which the path probe receives signal B edges and signal D edges nearly concurrently;

f. producing a second periodic signal having a period proportional to the second delay; and g. processing the first and second periodic signals to determine the path delay through the signal path.

19. The method in accordance with claim 18 wherein step g comprises the substeps of:

g1. generating a first count of a number of cycles of a reference clock that occur during a predetermined number of cycles of the first periodic signal;

g2. generating a number indicating a number of cycles of the reference clock that occurring during predetermined number of cycles of the second periodic signal and the first count.

20. An apparatus for carrying out a measurement process for measuring delay through a plurality of signal paths within an integrated circuit (IC), the apparatus comprising:

a strobe generator implemented within the IC, for receiving an OSC signal that may be either logically true or logically false, for receiving TUNE data, and for receiving a STROBE signal, for generating a signal A and a signal B when the OSC signal is logically false, each having an edge produced in delayed response to an edge of a STROBE signal supplied as input to the strobe generator, wherein the strobe generator provides a fixed delay between the STROBE signal edge and the signal A edge and provides a variable delay between the STROBE signal edge and the signal B edge, and wherein the variable delay is selected by TUNE data supplied as input to the strobe generator, and for generating an OSCOUT signal when the OSC signal is logically true, wherein the OSC output signal has a period that is proportional to the variable delay selected by the TUNE data; and a plurality of path probes implemented on the IC, each positioned proximate to a separate one of the signal paths, for receiving a TEST signal and a CAL signal that may be either logically true or logically false, for generating a signal C at its corresponding signal path input in response to signal A when the TEST signal is logically true such that the signal path produces a signal D at its output, wherein each of signals C and D change state in response to each signal A edge, for receiving signal B from the strobe generator and the signal D at its corresponding signal path output, for responding to each signal B edge when the CAL signal is logically true by generating at least one indicating signal indicating whether the signal C it supplies to its corresponding signal path changed state before the path probe received the signal B edge, and for responding to each signal B edge when the CAL signal is logically false by generating said least one indicating signal indicating whether the signal D appearing at its corresponding signal path output changed state before or after the path probe received the signal B edge.

21. The apparatus in accordance with claim 20 further comprising a control circuit implemented within the IC for supplying the STROBE signal and TUNE data as inputs to the strobe generator, for supplying the CAL signal as input to the path probes, and for monitoring indicating signals generated by the path probes.

22. The apparatus in accordance with claim 21 wherein during a first phase of the measurement process, the control circuit sets the OSC signal logically false, sets the CAL signal logically true, and then executes a plurality of iterations of a process in which during each iteration of the process, it adjusts the TUNE data, sends a STROBE signal edge to the strobe generator, and then monitors the indicating signals produced by the path probes, wherein the control circuit sets the TUNE data so that the strobe generator generates signal B edges with a different delay there between during each iteration of the process, until a pattern of successive indicating signal states indicates the TUNE data has reached a first setting for which at least one of the path probe circuits has received the C and B edges nearly concurrently.

wherein during a second phase of the measurement process, the control circuit sets the OSC signal TRUE so that the strobe generator generates the OSCOUT signal having a period that is proportional to the variable delay selected by the TUNE data at the first setting, wherein during a third phase of the measurement process, the control circuit sets the OSC signal logically false, sets the CAL signal logically false, and then executes a plurality of process iterations during each of which it adjusts the TUNE data, sends a STROBE signal edge to the strobe generator, and then monitors the indicating signals produced by the path probes, wherein the control circuit sets the TUNE data so that the strobe generator generates signal B edges with a different delay there between during each iteration of the process, until a pattern of successive indicating signal states indicates the TUNE data has reached a second setting for which at least one of the path probe circuits has received the D and B edges nearly concurrently, and wherein during a fourth phase of the measurement process, the control circuit sets the OSC signal TRUE so that the strobe generator generates the OSCOUT signal having a period that is proportional to the variable delay selected by the TUNE data at the second setting.

23. The apparatus in accordance with claim 22 further comprising a measurement circuit for monitoring the OSCOUT signal during the second and fourth phases of the measurement process to determine a path delay between edges of signals C and D, wherein the measurement circuit generates output data representing a difference between a first number of cycles of a reference clock signal that occur during K cycles of the OSCOUT signal during the fourth phase of the measurement process, and a second number of cycle of the reference clock signal that occur during K cycles of the OSCOUT signal during the second phase of the measurement process, where K is an integer greater than 1.

24. The apparatus in accordance with claim 23 wherein the strobe generator comprises:

a tapped delay line having an input and a plurality of taps, for delivering any signal appearing at its input to each of its taps with a different delay;

means for generating signal A in response to a signal appearing at one of the taps;

a first multiplexer controlled by the TUNE data for generating signal B in response to a signal appearing at any selected one of the taps, and a second multiplexer controlled by the OSC signal for selectively delivering either the STROBE signal or signal B as input to the tapped delay line.

25. The apparatus in accordance with claim 23 wherein the path probe comprises:

a logic gate having a control input for receiving signal B, a data input, and a data output for producing the indicating signal, such that the indicating signal is of a logic state that indicates a logic state of a signal at the data input when a B signal edge last arrived at the clock input, and a first multiplexer controlled by the CAL signal for selectively coupling either the C or D signal to the data input of the first logic gate.

26. The apparatus in accordance with claim 21 wherein the TUNE data also controls whether signal A changes to a state that matches or is opposite to a state of the STROBE signal during each signal A edge.

27. A method for determining whether all path delays through a plurality of signal paths within an IC are within a predetermined range, whether each signal path is of the type which produces an output signal D at its output having edges in delayed response to a signal C at its input, the method comprises:

a. forming a plurality of path probes within the IC each proximate to a separate one of the signal paths and connected to the signal path's input and output wherein each path probe supplies a signal C to its corresponding signal path's input in response to a signal A, and monitors the signal D produced at the corresponding signal path's output;

b. generating and supplying signal A and a signal B in common to the path probes, wherein signals A and B have edges generated in response to edges of a STROBE signal, wherein a STROBE-to-A edge delay is constant and a STROBE-to-B edge delay is variable, c. adjusting the STROBE-to-B edge delay to a first delay for which at least one of the path probes receives signal B edges and generates signal C edges nearly concurrently d. producing a first periodic signal having a period proportional to the first delay;

e. adjusting the STROBE-to-B edge delay to a second delay for which at east one of the path probe receives signal B edges and signal D edges nearly concurrently;

f. producing a second periodic signal having a period proportional to the second delay; and g. processing the first and second periodic signals to determine whether the path delays through all signal paths are within the predetermined range.

28. The method in accordance with claim 27 wherein step g comprises the substeps of:

g1. generating a first count of a number of cycles of a reference clock occurring during a predetermined number of cycles of the first periodic signal;

g2. generating a number indicating a number of cycles of the reference clock occurring during predetermined number of cycles of the second periodic signal and the first count.

* * * * *